(12) United States Patent
Usami et al.

(10) Patent No.: US 12,557,624 B2
(45) Date of Patent: Feb. 17, 2026

(54) SEMICONDUCTOR DEVICE WITH TOP WIRING COVERED BY MULTIPLE PASSIVATION FILMS TO PREVENT CRACKING AND METHOD OF MANUFACTURING THE SAME

(71) Applicant: RENESAS ELECTRONICS CORPORATION, Tokyo (JP)

(72) Inventors: Tatsuya Usami, Tokyo (JP); Yoshiki Maruyama, Tokyo (JP); Yuki Murayama, Tokyo (JP); Yuji Ishii, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 776 days.

(21) Appl. No.: 17/892,626

(22) Filed: Aug. 22, 2022

(65) Prior Publication Data

US 2023/0103256 A1    Mar. 30, 2023

(30) Foreign Application Priority Data

Sep. 27, 2021    (JP) .................................. 2021-156867

(51) Int. Cl.
*H01L 21/768* (2006.01)
*H01L 23/00* (2006.01)
*H01L 23/532* (2006.01)

(52) U.S. Cl.
CPC .................. *H01L 21/76837* (2013.01); *H01L 21/76885* (2013.01); *H01L 23/53295* (2013.01);
(Continued)

(58) Field of Classification Search
CPC ............. H01L 2924/3512; H01L 24/49; H01L 21/76837; H01L 21/76885; H01L 2224/0391
See application file for complete search history.

(56) References Cited

U.S. PATENT DOCUMENTS 6,211,570 B1 * 4/2001 Kakamu ........... H01L 21/76835
257/797
9,881,868 B2    1/2018 Tokumitsu
(Continued)

FOREIGN PATENT DOCUMENTS

JP      H11-097533 A      4/1999
JP      H1197533 A  *  4/1999   ........ H01L 21/02211
(Continued)

OTHER PUBLICATIONS

Office Action dated Dec. 24, 2024, from corresponding Japanese Patent Application No. 2021-156867, 14 pages.
(Continued)

*Primary Examiner* — Ratisha Mehta
*Assistant Examiner* — Adam Joseph Mott
(74) *Attorney, Agent, or Firm* — Rimon P.C.

(57) ABSTRACT

A semiconductor device includes: a semiconductor substrate having first and second main surfaces; interlayer insulating films laminated on the first main surface in a thickness direction from the second main surface toward the first main surface; a top wiring arranged on a top interlayer insulating film of the plurality of interlayer insulating films, which is provided farthest from the first main surface in the thickness direction; and a passivation film arranged on the top interlayer insulating film so as to cover the top wiring. The top wiring includes a first wiring portion and a second wiring portion that extend in a first direction in plan view and are adjacent to each other in a second direction orthogonal to the first direction. A first distance between an upper surface of the top wiring and the top interlayer insulating film in the thickness direction is 2.7 μm or more.

4 Claims, 19 Drawing Sheets

(52) U.S. Cl.
CPC .............. *H01L 24/03* (2013.01); *H01L 24/05* (2013.01); *H01L 24/49* (2013.01); *H01L 2224/0391* (2013.01); *H01L 2224/05124* (2013.01); *H01L 2224/05565* (2013.01); *H01L 2224/05688* (2013.01); *H01L 2924/05042* (2013.01); *H01L 2924/05442* (2013.01); *H01L 2924/05994* (2013.01); *H01L 2924/3512* (2013.01)

(56) References Cited

U.S. PATENT DOCUMENTS

| | | | | |
|---|---|---|---|---|
| 10,504,861 | B2 * | 12/2019 | Moriyama | H01L 23/5226 |
| 10,755,995 | B2 * | 8/2020 | Wang | H01L 23/3171 |
| 11,670,559 | B2 * | 6/2023 | Choi | H01L 23/528 |
| | | | | 257/773 |
| 2006/0019499 | A1 * | 1/2006 | Jang | H01L 21/76837 |
| | | | | 257/E21.279 |
| 2017/0287868 | A1 * | 10/2017 | Isozaki | H01L 24/48 |
| 2018/0166406 | A1 * | 6/2018 | Shih | H01L 21/76837 |
| 2018/0233466 | A1 * | 8/2018 | Yen | H01L 24/03 |
| 2021/0249321 | A1 * | 8/2021 | Wu | H01L 21/76885 |
| 2022/0254697 | A1 * | 8/2022 | Liu | H01L 23/3171 |

FOREIGN PATENT DOCUMENTS

| | | | | |
|---|---|---|---|---|
| JP | 2006-041505 | A | | 2/2006 |
| JP | 2017-183672 | A | | 10/2017 |
| JP | 2018-186285 | A | | 11/2018 |
| JP | 2019-012738 | A | | 1/2019 |
| JP | 2023047766 | A | * | 4/2023 ............. H01L 24/03 |

OTHER PUBLICATIONS

Office Action dated May 20, 2025, from corresponding Japan Application No. 2021-156867, 6 pages.

\* cited by examiner

SEMICONDUCTOR DEVICE WITH TOP WIRING COVERED BY MULTIPLE PASSIVATION FILMS TO PREVENT CRACKING AND METHOD OF MANUFACTURING THE SAME

CROSS-REFERENCE TO RELATED APPLICATIONS

The disclosure of Japanese Patent Application No. 2021-156867 filed on Sep. 27, 2021 including the specification, drawings and abstract is incorporated herein by reference in its entirety.

BACKGROUND

The present invention relates to a semiconductor device and a method of manufacturing the same.

There are disclosed techniques listed below. [Patent Document 1] Japanese Unexamined Patent Application Publication No. 2018-186285

For example, Patent Document 1 describes a semiconductor device. The semiconductor device described in Patent Document 1 includes a semiconductor substrate, a plurality of interlayer insulating films, top wirings, and a passivation film.

The semiconductor substrate includes a first main surface and a second main surface. The second main surface is the opposite surface of the first main surface. A direction from the second main surface toward the first main surface is defined as a thickness direction. The plurality of interlayer insulating films is laminated and arranged on the first main surface in the thickness direction. An interlayer insulating film of the plurality of interlayer insulating films provided farthest from the first main surface in the thickness direction is defined as a top interlayer insulating film. The top wirings are arranged on the top interlayer insulating film. Each of the top wirings is formed of aluminum or an aluminum alloy. The passivation film includes a silicon oxide film and a silicon nitride film. The silicon oxide film is arranged on the top interlayer insulating film so as to cover the top wirings. The silicon nitride film is arranged on the silicon oxide film. Note that the silicon oxide film is a TEOS (TetraEthOxy Silane) film formed using a plasma CVD (Chemical Vapor Deposition) method.

SUMMARY

When an interval between portions of adjacent top wirings is smaller as compared with a thickness of each of the top wirings and an HDP-CVD (High Density Plasma Chemical Vapor Deposition) method is used to further embed a site between the portions of the adjacent top wirings by a silicon oxide film, an application time of bias at the time of film formation becomes longer, and temperature of a wafer thus rises. As the temperature of the wafer rises, a crack may occur at a portion of the silicon oxide film provided between the portions of the adjacent top wirings due to a difference in a coefficient of thermal expansion between the top wiring and the silicon oxide film.

The present disclosure provides a semiconductor device and a method of manufacturing the semiconductor device capable of suppressing the occurrence of a crack in a silicon oxide film between portions of adjacent top wirings.

A semiconductor device according to an embodiment includes: a semiconductor substrate having a first main surface and a second main surface, the second main surface being an opposite surface of the first main surface; a plurality of interlayer insulating films laminated and arranged on the first main surface in a thickness direction, the thickness direction being a direction from the second main surface toward the first main surface; a top wiring arranged on a top interlayer insulating film, the top interlayer insulating film being an interlayer insulating film of the plurality of interlayer insulating films and provided farthest from the first main surface in the thickness direction; and a passivation film arranged on the top interlayer insulating film so as to cover the top wiring. The top wiring includes a first wiring portion and a second wiring portion that extend in a first direction in plan view and are adjacent to each other in a second direction orthogonal to the first direction. A distance between an upper surface of the top wiring and the top interlayer insulating film in the thickness direction is defined as a first distance, and the first distance is 2.7 μm or more. The top wiring has a portion where a value obtained by dividing the first distance by a second distance is 1.35 or more, the second distance being a distance between the first wiring portion and the second wiring portion in the second direction. The passivation film includes a silicon oxide film, and a silicon nitride film or a silicon oxynitride film arranged on the silicon oxide film. The silicon oxide film has a first layer, and a second layer arranged on the first layer. A distance between an upper surface of a portion of the first layer, which is provided between the first wiring portion and the second wiring portion, and the top interlayer insulating film in the thickness direction is 0.42 times or less as long as the first distance. A distance between an upper surface of a portion of the second layer, which is provided between the first wiring portion and the second wiring portion, and the top interlayer insulating film in the thickness direction is 0.65 times or more as long as the first distance. Each of the first layer and the second layer is an HDP-CVD film.

A method of manufacturing a semiconductor device according to an embodiment includes: preparing a semiconductor substrate having a first main surface and a second main surface, the second main surface being an opposite surface of the first main surface; forming a plurality of interlayer insulating films laminated and arranged on the first main surface in a thickness direction, the thickness direction being a direction from the second main surface toward the first main surface; forming a top wiring arranged on a top interlayer insulating film, the top interlayer insulating film being an interlayer insulating film of the plurality of interlayer insulating films and provided farthest from the first main surface in the thickness direction; and forming a passivation film arranged on the top interlayer insulating film so as to cover the top wiring. The top wiring includes a first wiring portion and a second wiring portion that extend in a first direction in plan view and are adjacent to each other in a second direction orthogonal to the first direction. A distance between an upper surface of the top wiring and the top interlayer insulating film in the thickness direction is defined as a first distance, and the first distance is 2.7 μm or more. The top wiring has a portion where a value obtained by dividing the first distance by a second distance is 1.35 or more, the second distance being a distance between the first wiring portion and the second wiring portion in the second direction. The forming the passivation film includes forming a silicon oxide film, and forming a silicon nitride film or a silicon oxynitride film arranged on the silicon oxide film. The forming the silicon oxide film includes a first step of forming a first layer by an HDP-CVD method, and a second step of forming a second layer arranged on the first layer by an HDP-CVD method. The first step is finished before a distance between an upper surface of a portion of the first layer, which is provided between the first wiring portion and the second wiring portion, and the top interlayer insulating film in the thickness direction exceeds 0.42 times or less as long as the first distance. The second step is finished after a distance between an upper surface of a portion of the second layer, which is provided between the first wiring portion and the second wiring portion, and the top interlayer insulating film in the thickness direction becomes 0.65 times or more as long as the first distance.

According to the semiconductor device and the method of manufacturing the semiconductor device of the embodiments, it is possible to suppress the occurrence of a crack in a silicon oxide film between portions of adjacent top wirings.

DETAILED DESCRIPTION

Figure 1:
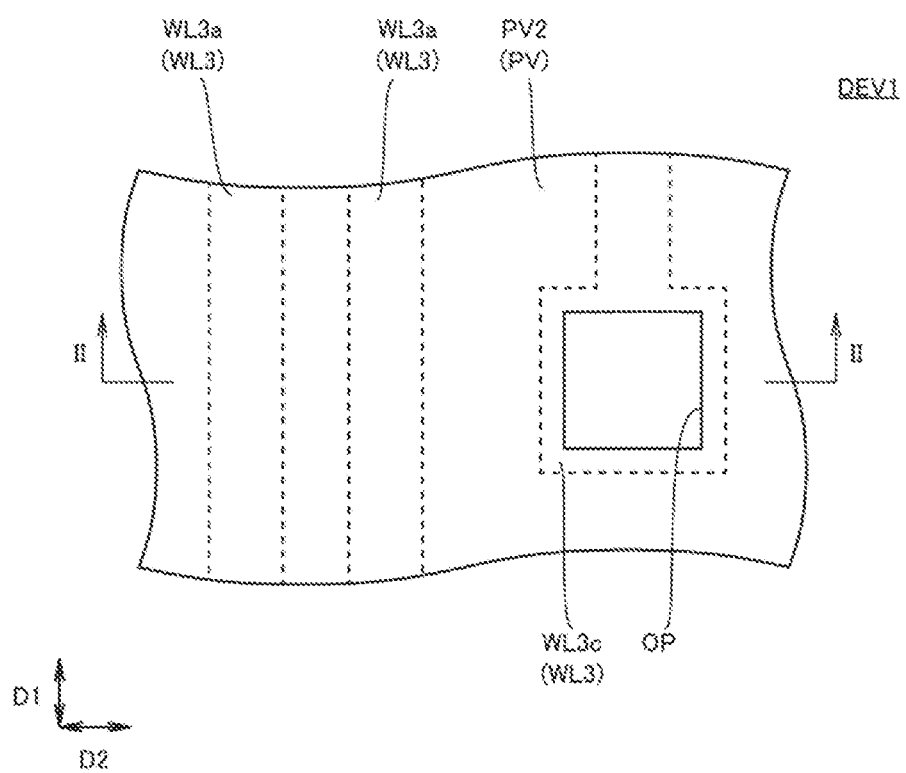
FIG. 1 is a plan view of a semiconductor device DEV1.

Hereinafter, embodiments will be described with reference to the drawings. In the following drawings, the same reference numerals are respectively assigned to the same or corresponding parts, and duplicate explanation will not be repeated.

First Embodiment

A semiconductor device according to a first embodiment will be described. The semiconductor device according to the first embodiment is referred to as a semiconductor device DEV1.

<Configuration of Semiconductor Device DEV1>

Hereinafter, a configuration of the semiconductor device DEV1 will be described.

Figure 2:
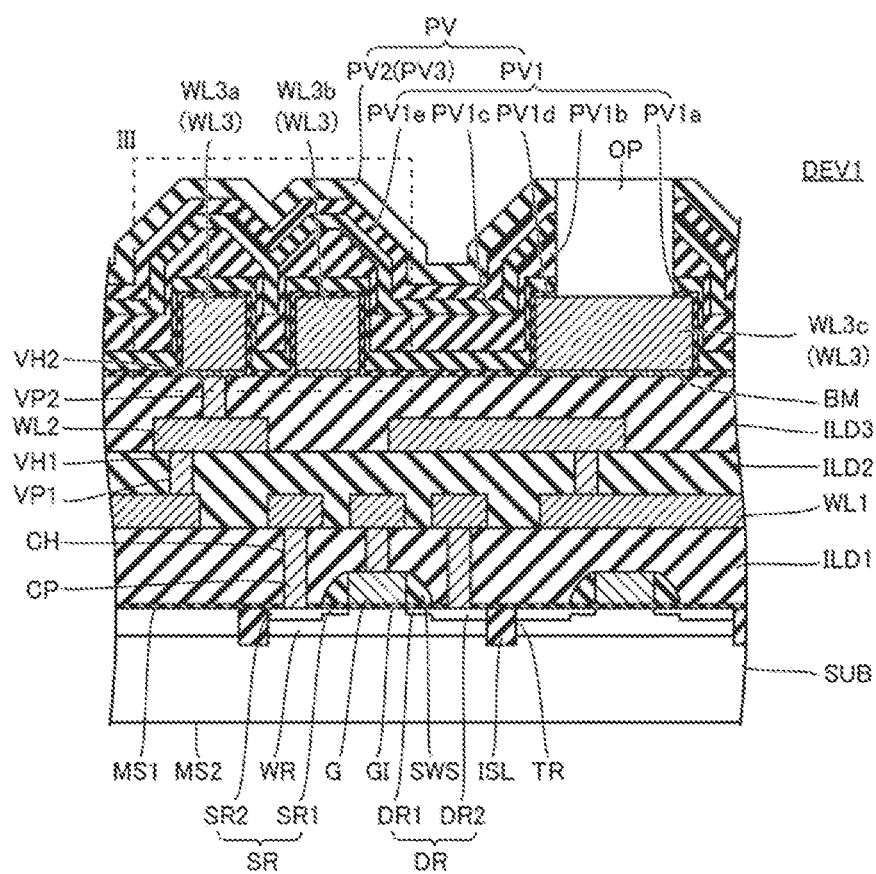
FIG. 2 is a sectional view taken along a line II-II in FIG. 1.
Figure 3:
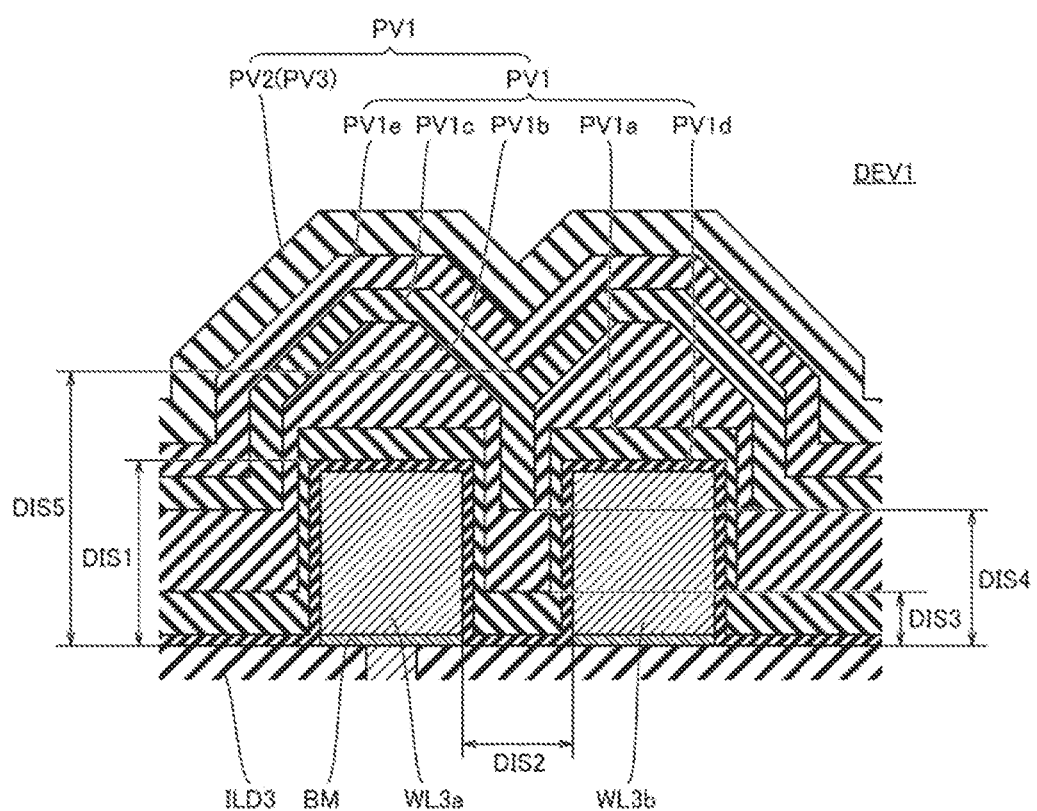
FIG. 3 is an enlarged view of III in FIG. 2.

FIG. 1 is a plan view of the semiconductor device DEV1. FIG. 2 is a sectional view taken along a line II-II in FIG. 1. FIG. 3 is an enlarged view of III in FIG. 2. As illustrated in FIG. 1 to FIG. 3, the semiconductor device DEV1 includes a semiconductor substrate SUB, element isolation films ISL, gate insulating films GI, gates G, sidewall spacers SWS, an interlayer insulating film ILD1, contact plugs CP, wirings WL1, an interlayer insulating film ILD2, via plugs VP1, wirings WL2, an interlayer insulating film ILD3, a via plug VP2, wirings WL3, and a passivation film PV.

The semiconductor substrate SUB has a first main surface MS1 and a second main surface MS2. The first main surface MS1 and the second main surface MS2 constitute end surfaces in a thickness direction of the semiconductor substrate SUB. The second main surface MS2 is the opposite surface of the first main surface MS1. A direction from the second main surface MS2 toward the first main surface MS1 is defined as the thickness direction. The semiconductor substrate SUB is formed of single crystal silicon (Si), for example.

A well region WR, a source region SR, and a drain region DR are formed in the semiconductor substrate SUB. Dopant is injected into the source region SR and the drain region DR so that a conductive type thereof becomes a first conductive type. Dopant is injected into the well region WR so that a conductive type thereof becomes a second conductive type. The first conductive type is an n-type, for example. The second conductive type is an opposite conductive type to the first conductive type. Namely, in a case where the first conductive type is an n-type, for example, the second conductive type is a p-type.

The well region WR is formed in the first main surface MS1. The source region SR and the drain region DR are formed in the first main surface MS1 so as to be surrounded by the well region WR. The source region SR and the drain region DR are separated from each other.

The source region SR includes a first portion SR1 and a second portion SR2. The first portion SR1 is closer to the drain region DR than the second portion SR2. Impurity concentration in the second portion SR2 is higher than impurity concentration in the first portion SR1. Namely, the source region SR has an LDD (Lightly Doped Diffusion) structure.

The drain region DR includes a first portion DR1 and a second portion DR2. The first portion DR1 is closer to the source region SR than the second portion DR2. Impurity concentration in the second portion DR2 is higher than impurity concentration in the first portion DR1. Namely, the drain region DR has an LDD structure.

A trench TR is formed in the first main surface MS1. The trench TR extends from the first main surface MS1 toward the second main surface MS2 side. Although it is not illustrated, the trench TR is formed so as to surround the well region WR in plan view. The element isolation films ISL are embedded in the trench TR. The element isolation films ISL are formed of silicon oxide ($SiO_2$), for example. As a result, an STI (Shallow Trench Isolation) is formed. Note that in this example, element isolation is performed by the STI, but the element isolation may be performed by a LOCOS (LOCal Oxidation of Silicon).

The gate insulating films GI are arranged on the first main surface MS1. The gate insulating films GI are formed of silicon oxide, for example. The gate G is arranged on the gate insulating film GI. More specifically, the gate G faces a portion of the first main surface MS1 provided between the source region SR and the drain region DR with the gate insulating film GI interposed therebetween. The gate G is formed of polycrystalline silicon containing a dopant, for example. The well region WR, the source region SR, the drain region DR, the gate insulating film GI and the gate G constitute a transistor.

The sidewall spacers SWS are arranged on the gate insulating film GI. More specifically, the sidewall spacers SWS are respectively arranged on a portion of the gate insulating film GI covering the first portion SR1 and a portion of the gate insulating film GI covering the first portion DR1. The sidewall spacers SWS are formed so as to be in contact with side surfaces of the gate G. The sidewall spacers SWS are formed of silicon nitride (SiN), for example.

The interlayer insulating film ILD1 is arranged on the first main surface MS1 so as to cover the gate insulating film GI, the gate G, and the sidewall spacers SWS. The interlayer insulating film ILD1 is formed of silicon oxide, for example.

Contact holes CH are formed in the interlayer insulating film ILD1. Each of the contact holes CH penetrates the interlayer insulating film ILD1 along the thickness direction. Each of the contact holes CH also penetrates the gate insulating film GI. The source region SR, the drain region DR, and the gate G are respectively exposed from the contact holes CH. Note that although it is not illustrated, portions of the source region SR, the drain region DR, and the gate G exposed from the contact holes CH may be silicified.

The contact plugs CP are embedded in the contact holes CH. The contact plugs CP are formed of tungsten (W), for example. The contact plugs CP are electrically connected to the source region SR, the drain region DR, and the gate G. Note that although it is not illustrated, a barrier metal formed of titanium (Ti) and titanium nitride (TiN), for example, may be arranged between an inner wall surface of the contact hole CH and the contact plug CP.

The wirings WL1 are arranged on the interlayer insulating film ILD1. The wirings WL1 are electrically connected to the contact plugs CP. The wirings WL1 are formed of aluminum (Al) or an aluminum alloy, for example. Note that although it is not illustrated, a barrier metal formed of titanium and titanium nitride may be arranged between the interlayer insulating film ILD1 and the wiring WL1. Further, although it is not illustrated, an antireflection film formed of titanium nitride may be formed on the wiring WL1.

The interlayer insulating film ILD2 is arranged on the interlayer insulating film ILD1 so as to cover the wiring WL1. The interlayer insulating film ILD2 is formed of silicon oxide, for example. Via holes VH1 are formed in the interlayer insulating film ILD2. Each of the via holes VH1 penetrates the interlayer insulating film ILD2 along the thickness direction. The wiring WL1 is exposed from the via holes VH1. The via plug VP1 is embedded in each of the via holes VH1.

Each of the via plugs VP1 is electrically connected to the wiring WL1. The via plug VP1 is formed of tungsten, for example. Although it is not illustrated, a barrier metal formed of titanium and titanium nitride may be arranged between an inner wall surface of the via hole VH1 and the via plug VP1.

The wiring WL2 are arranged on the interlayer insulating film ILD2. The wirings WL2 are electrically connected to the via plug VP1. The wirings WL2 are formed of aluminum or an aluminum alloy, for example. Note that although it is not illustrated, a barrier metal formed of titanium and titanium nitride may be arranged between the interlayer insulating film ILD2 and the wiring WL2.

Further, although it is not illustrated, an antireflection film formed of titanium nitride may be formed on the wiring WL2.

The interlayer insulating film ILD3 is arranged on the interlayer insulating film ILD2 so as to cover the wiring WL2. The interlayer insulating film ILD3 is formed of silicon oxide, for example. A via hole VH2 is formed in the interlayer insulating film ILD3. The via hole VH2 penetrates the interlayer insulating film ILD3 along the thickness direction. The wiring WL2 is exposed from the via hole VH2. The via plug VP2 is embedded in the via hole VH2.

As described above, the plurality of interlayer insulating films (including the interlayer insulating film ILD1, the interlayer insulating film ILD2, and the interlayer insulating film ILD3) is laminated and arranged on the first main surface MS1 in the thickness direction, and the interlayer insulating film ILD3 of the plurality of interlayer insulating films is an interlayer insulating film provided farthest from the first main surface MS1. Namely, the interlayer insulating film ILD3 is a top interlayer insulating film. In the above, the number of interlayer insulating films laminated and arranged on the first main surface MS1 is three, but the number of interlayer insulating films laminated and arranged on the first main surface MS1 may be two, or four or more.

The via plug VP2 is electrically connected to the wiring WL2. The via plug VP2 is formed of tungsten, for example. Although it is not illustrated, a barrier metal formed of titanium and titanium nitride is arranged between an inner wall surface of the via hole VH2 and the via plug VP2.

The wirings WL3 are arranged on the interlayer insulating film ILD3. Namely, the wiring WL3 is a top wiring. The wirings WL3 are electrically connected to the via plug VP2. The wirings WL3 are formed of aluminum or an aluminum alloy, for example. A barrier metal BM formed of titanium and titanium nitride is arranged between the interlayer insulating film ILD3 and the wiring WL3.

The wiring WL3 includes a first wiring portion WL3a, a second wiring portion WL3b, and a bonding pad portion WL3c. Each of the first wiring portion WL3a and the second wiring portion WL3b extends along a first direction D1 in plan view. The first wiring portion WL3a and the second wiring portion WL3b are adjacent to each other in a second direction D2. The second direction D2 is a direction orthogonal to the first direction D1.

A distance between an upper surface of the wiring WL3 and an upper surface of the interlayer insulating film ILD3 in the thickness direction is defined as a first distance DIS1. A distance between the first wiring portion WL3a and the second wiring portion WL3b in the second direction D2 is defined as a second distance DIS2. The first distance DIS1 is 2.7 μm or more. The wiring WL3 has a portion where a value obtained by dividing the first distance DIS1 by the second distance DIS2 is 1.35 or more.

The passivation film PV is arranged on the interlayer insulating film ILD3 so as to cover the wiring WL3. The passivation film PV includes a silicon oxide film PV1 and a silicon nitride film PV2.

The silicon oxide film PV1 is formed of silicon oxide. The silicon oxide film PV1 includes a first layer PV1a, a second layer PV1b, and a third layer PV1c. The silicon oxide film PV1 may further include a fourth layer PV1d and a fifth layer PV1e.

Each of the first layer PV1a, the second layer PV1b, and the third layer PV1c is an HDP-CVD film. Namely, the first layer PV1a, the second layer PV1b, and the third layer PV1c are silicon oxide films formed by an HDP-CVD method. The fourth layer PV1d and the fifth layer PV1e are not HDP-CVD films. Since the first layer PV1a, the second layer PV1b, and the third layer PV1c are the HDP-CVD films, an upper surface of each of the first layer PV1a, the second layer PV1b, and the third layer PV1c becomes a trapezoidal or triangular shape on the wiring WL3.

The fourth layer PV1d is arranged on the interlayer insulating film ILD3 so as to cover the wiring WL3. The first layer PV1a is arranged on the fourth layer PV1d. The second layer PV1b is arranged on the first layer PV1a. The third layer PV1c is arranged on the second layer PV1b. The fifth layer PV1e is arranged on the third layer PV1c.

A distance between the upper surface of a portion of the first layer PV1a provided between the first wiring portion WL3a and the second wiring portion WL3b in the thickness direction and the upper surface of the interlayer insulating film ILD3 is defined as a third distance DIS3. Note that the third distance DIS3 is measured at a position where the distance between the upper surface of a portion of the first layer PV1a provided between the first wiring portion WL3a and the second wiring portion WL3b in the thickness direction and the upper surface of the interlayer insulating film ILD3 becomes the minimum.

A distance between the upper surface of a portion of the second layer PV1b provided between the first wiring portion WL3a and the second wiring portion WL3b in the thickness direction and the upper surface of the interlayer insulating film ILD3 is defined as a fourth distance DIS4. Note that the fourth distance DIS4 is measured at a position where the distance between the upper surface of a portion of the second layer PV1b provided between the first wiring portion WL3a and the second wiring portion WL3b in the thickness direction and the upper surface of the interlayer insulating film ILD3 becomes the minimum.

A distance between the upper surface of a portion of the third layer PV1c provided between the first wiring portion WL3a and the second wiring portion WL3b in the thickness direction and the upper surface of the interlayer insulating film ILD3 is defined as a fifth distance DIS5. Note that the fifth distance DIS5 is measured at a position where the distance between the upper surface of a portion of the third layer PV1c provided between the first wiring portion WL3a and the second wiring portion WL3b in the thickness direction and the upper surface of the interlayer insulating film ILD3 becomes the minimum.

The third distance DIS3 is 0.42 times or less as long as the first distance DIS1. The fourth distance DIS4 is 0.65 times or more as long as the first distance DIS1. The fifth distance DIS5 is 1.00 times or more as long as the first distance DIS1. From another point of view, a space between the first wiring portion WL3a and the second wiring portion WL3b is completely embedded by the HDP-CVD film. The fourth distance DIS4 may become 1.00 times or more as long as the first distance DIS1. In this case, the silicon oxide film PV1 may not have the third layer PV1c.

Note that an interface between the fourth layer PV1d and the first layer PV1a, an interface between the first layer PV1a and the second layer PV1b, an interface between the second layer PV1b and the third layer PV1c, and an interface between the third layer PV1c and the fifth layer PV1e can be identified by relief etching a cross section of the semiconductor device DEV1 with mixed acid OJ (mixed solution of HF, NH$_4$F, and CH$_3$COOH) for 5 to 10 seconds.

The silicon nitride film PV2 is formed of silicon nitride. The silicon nitride film PV2 is arranged on the silicon oxide film PV1. More specifically, the silicon nitride film PV2 is arranged on the fifth layer PV1e. Instead of the silicon nitride film PV2, a silicon oxynitride film PV3 may be used. The silicon oxynitride film PV3 is formed of silicon oxynitride (SiON). The silicon oxynitride film PV3 is arranged on the silicon oxide film PV1.

An opening OP is formed in the passivation film PV. The opening OP penetrates the passivation film PV along the thickness direction. The bonding pad portion WL3c is exposed from the opening OP.

<Method of Manufacturing Semiconductor Device DEV1>

Hereinafter, a method of manufacturing the semiconductor device DEV1 will be described.

Figure 4:
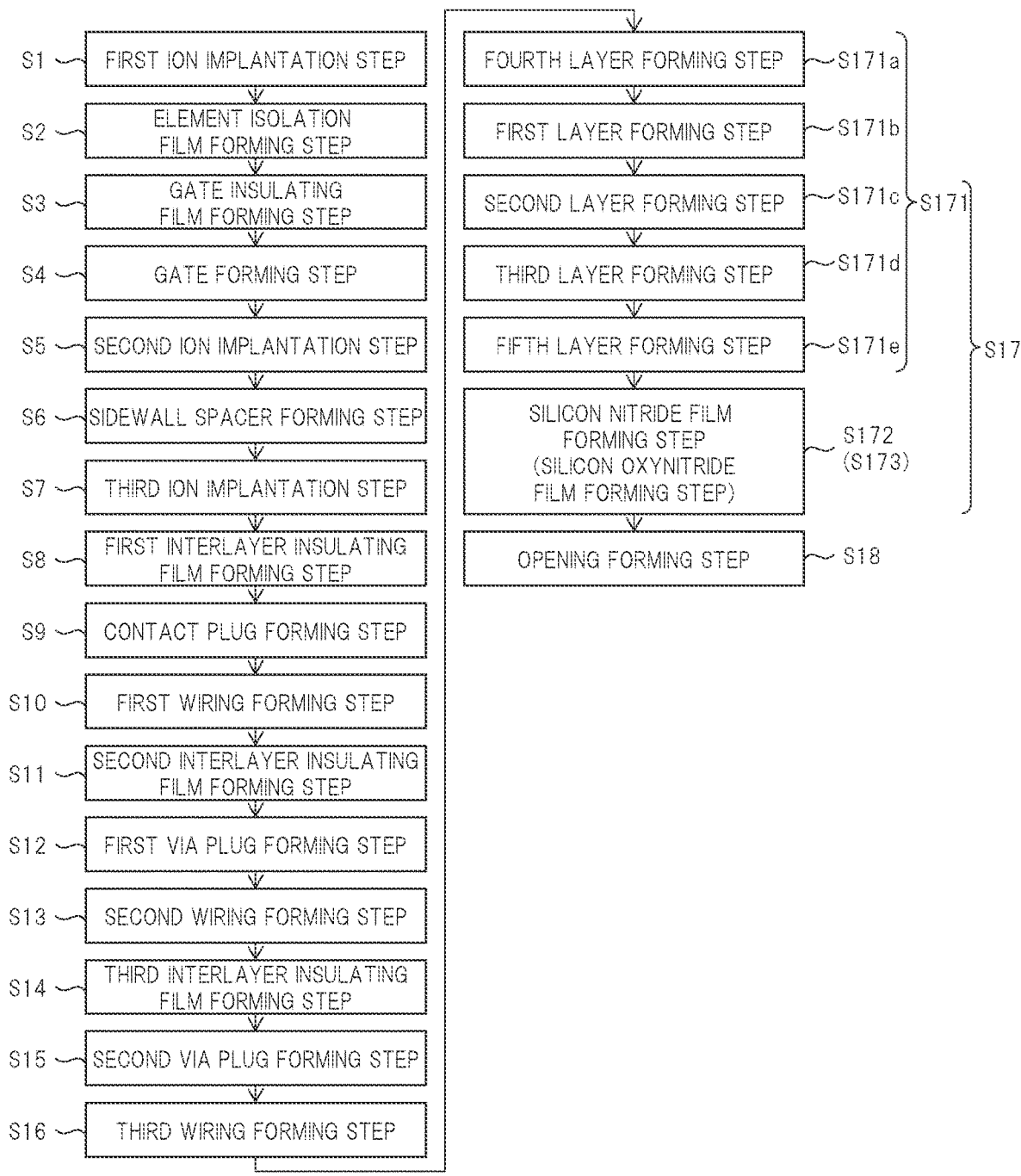
FIG. 4 is a process drawing illustrating a method of manufacturing the semiconductor device DEV1.

FIG. 4 is a process drawing illustrating a method of manufacturing the semiconductor device DEV1. As illustrated in FIG. 4, the method of manufacturing the semiconductor device DEV1 includes a first ion implantation step S1, an element isolation film forming step S2, a gate insulating film forming step S3, a gate forming step S4, a second ion implantation step S5, a sidewall spacer forming step S6, and a third ion implantation step S7.

The method of manufacturing the semiconductor device DEV1 further includes a first interlayer insulating film forming step S8, a contact plug forming step S9, a first wiring forming step S10, a second interlayer insulating film forming step S11, a first via plug forming step S12, a second wiring forming step S13, a third interlayer insulating film forming step S14, a second via plug forming step S15, a third wiring forming step S16, a passivation film forming step S17, and an opening forming step S18.

Figure 5:
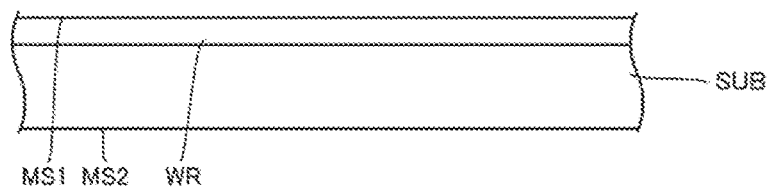
FIG. 5 is a sectional view for explaining a first ion implantation step S1.

FIG. 5 is a sectional view for explaining the first ion implantation step S1. As illustrated in FIG. 5, in the first ion implantation step S1, a well region WR is formed by performing ion implantation.

Figure 6:
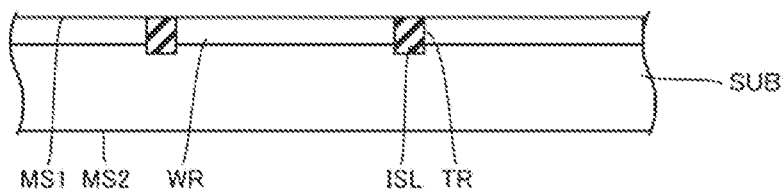
FIG. 6 is a sectional view for explaining an element isolation film forming step S2.

FIG. 6 is a sectional view for explaining the element isolation film forming step S2. As illustrated in FIG. 6, in the element isolation film forming step S2, trenches TR are first formed. The formation of the trenches TR is performed by dry etching. Second, constituent material of an element isolation film ISL is embedded in each of the trenches TR. The embedding of the constituent material of the element isolation film ISL is performed by CVD (Chemical Vapor Deposition), for example. Third, the constituent material of the element isolation film ISL protruding from the trenches TR is removed. The removal of the constituent material of the element isolation film ISL protruding from the trenches TR is performed by CMP (Chemical Mechanical Polishing), for example.

Figure 7:
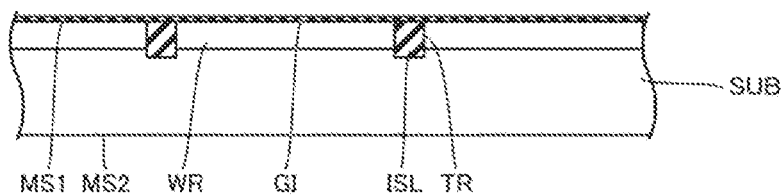
FIG. 7 is a sectional view for explaining a gate insulating film forming step S3.

FIG. 7 is a sectional view for explaining the gate insulating film forming step S3. As illustrated in FIG. 7, in the gate insulating film forming step S3, a gate insulating film GI is formed. The formation of the gate insulating film GI is performed by thermally oxidizing the first main surface MS1.

Figure 8:
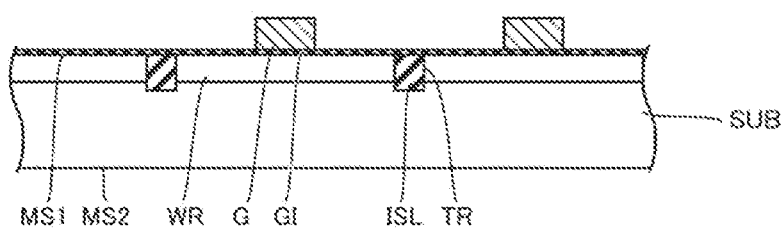
FIG. 8 is a sectional view for explaining a gate forming step S4 in which a gate G is formed.

FIG. 8 is a sectional view for explaining the gate forming step S4 in which the gate G is formed. In the gate forming step S4, first, constituent material of a gate G is formed on the gate insulating film GI. This film formation is performed by CVD, for example. Second, the formed constituent material of the gate G is patterned. This patterning is performed by photolithography and dry etching.

Figure 9:
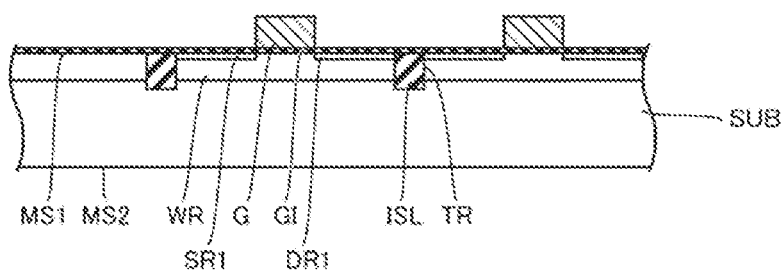
FIG. 9 is a sectional view for explaining a second ion implantation step S5.

FIG. 9 is a sectional view for explaining the second ion implantation step S5. As illustrated in FIG. 9, in the second ion implantation step S5, a first portion SR1 and a first portion DR1 are formed by performing ion implantation using the element isolation film ISL and the gate G as masks.

Figure 10:
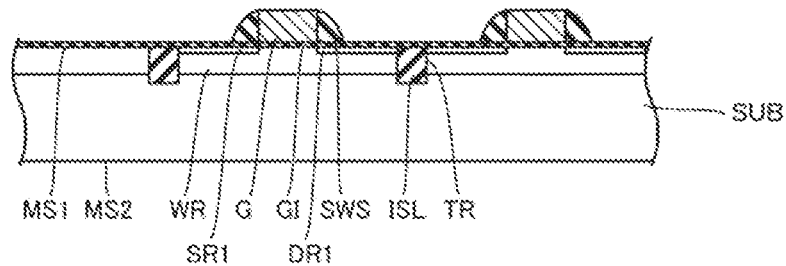
FIG. 10 is a sectional view for explaining a sidewall spacer forming step S6.

FIG. 10 is a sectional view for explaining the sidewall spacer forming step S6. As illustrated in FIG. 10, in the sidewall spacer forming step S6, sidewall spacers SWS are formed. In the sidewall spacer forming step S6, first, constituent material of the sidewall spacers SWS is formed on the gate insulating film GI so as to cover the gate G. Second, etching back is performed on the formed constituent material of the sidewall spacers SWS.

Figure 11:
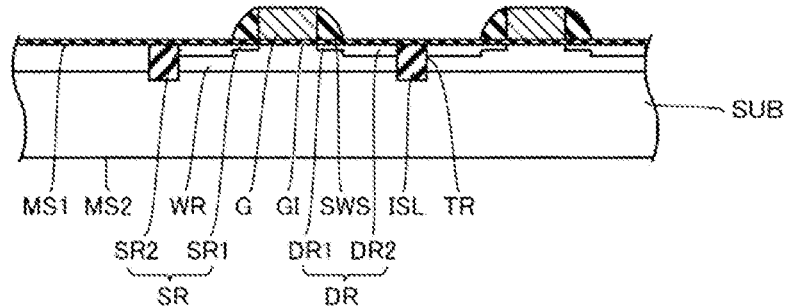
FIG. 11 is a sectional view for explaining a third ion implantation step S7.

FIG. 11 is a sectional view for explaining the third ion implantation step S7. As illustrated in FIG. 11, in the third ion implantation step S7, a second portion SR2 and a second portion DR2 are formed by performing ion implantation.

Figure 12:
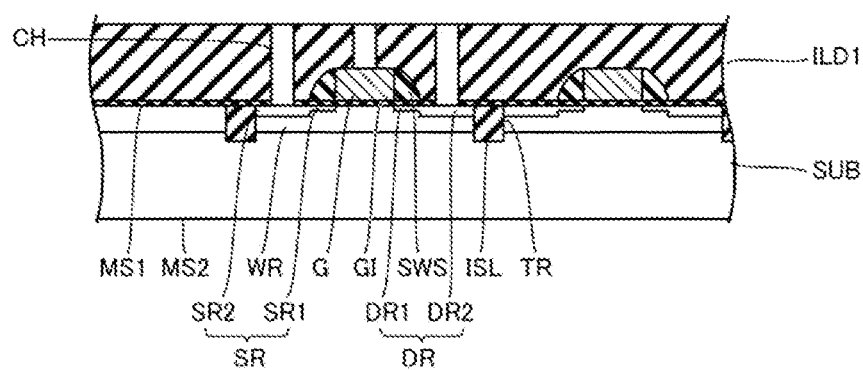
FIG. 12 is a sectional view for explaining a first interlayer insulating film forming step S8.

FIG. 12 is a sectional view for explaining the first interlayer insulating film forming step S8. As illustrated in FIG. 12, in the first interlayer insulating film forming step S8, an interlayer insulating film ILD1 is formed. In the first interlayer insulating film forming step S8, first, constituent material of the interlayer insulating film ILD1 is formed so as to cover the gate insulating film GI, the sidewall spacers SWS, and the gate G. This film formation is performed by CVD, for example. Second, the formed constituent material of the interlayer insulating film ILD1 is flattened by CMP, for example. As a result, the interlayer insulating film ILD1 is formed. Third, contact holes CH are formed in the interlayer insulating film ILD1 and the gate insulating film GI by performing dry etching on the interlayer insulating film ILD1 and the gate insulating film GI.

Figure 13:
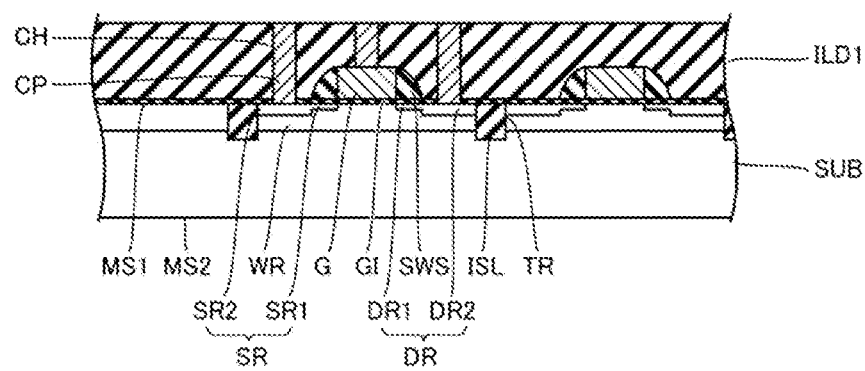
FIG. 13 is a sectional view for explaining a contact plug forming step S9.

FIG. 13 is a sectional view for explaining the contact plug forming step S9. As illustrated in FIG. 13, in the contact plug forming step S9, contact plugs CP are formed. In the contact plug forming step S9, first, constituent material of the contact plugs CP is embedded in the contact holes CH by CVD or the like. Second, the constituent material of the contact plugs CP protruding from the contact holes CH is removed by CMP, for example.

Figure 14:
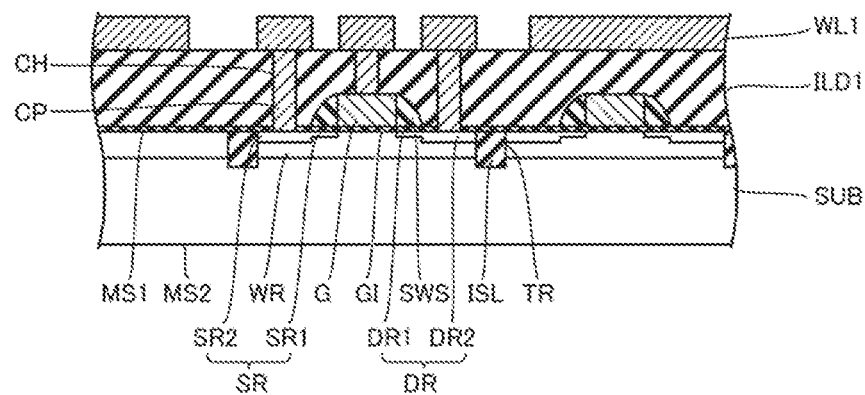
FIG. 14 is a sectional view for explaining a first wiring forming step S10.

FIG. 14 is a sectional view for explaining the first wiring forming step S10. As illustrated in FIG. 14, in the first wiring forming step S10, a wiring WL1 is formed. In the first wiring forming step S10, first, constituent material of the wiring WL1 is formed by sputtering or the like. Second, the formed constituent material of the wiring WL1 is patterned by photolithography and etching, for example.

Figure 15:
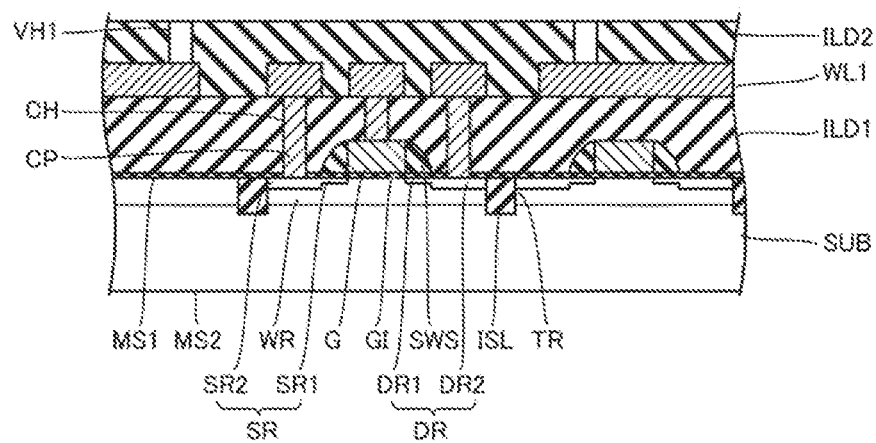
FIG. 15 is a sectional view for explaining a second interlayer insulating film forming step S11.

FIG. 15 is a sectional view for explaining the second interlayer insulating film forming step S11. As illustrated in FIG. 15, in the second interlayer insulating film forming step S11, an interlayer insulating film ILD2 is formed. In the second interlayer insulating film forming step S11, first, constituent material of the interlayer insulating film ILD2 is formed on the interlayer insulating film ILD1 so as to cover the wiring WL1. This film formation is performed by CVD, for example. Second, the formed constituent material of the interlayer insulating film ILD2 is flattened by CMP, for example. As a result, the interlayer insulating film ILD2 is formed. Third, via holes VH1 are formed in the interlayer insulating film ILD2 by performing dry etching on the interlayer insulating film ILD2.

Figure 16:
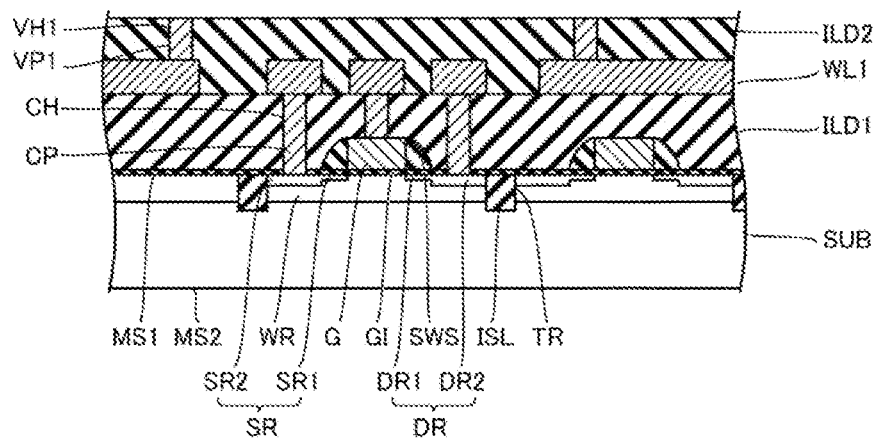
FIG. 16 is a sectional view for explaining a first via plug forming step S12.

FIG. 16 is a sectional view for explaining the first via plug forming step S12. As illustrated in FIG. 16, via plugs VP1 are formed in the first via plug forming step S12. In the first via plug forming step S12, first, constituent material of the via plug VP1 is embedded in the via holes VH1 by CVD, for example. Second, the constituent material of the via plug VP1 protruding from the via hole VH1 is removed by CMP, for example.

Figure 17:
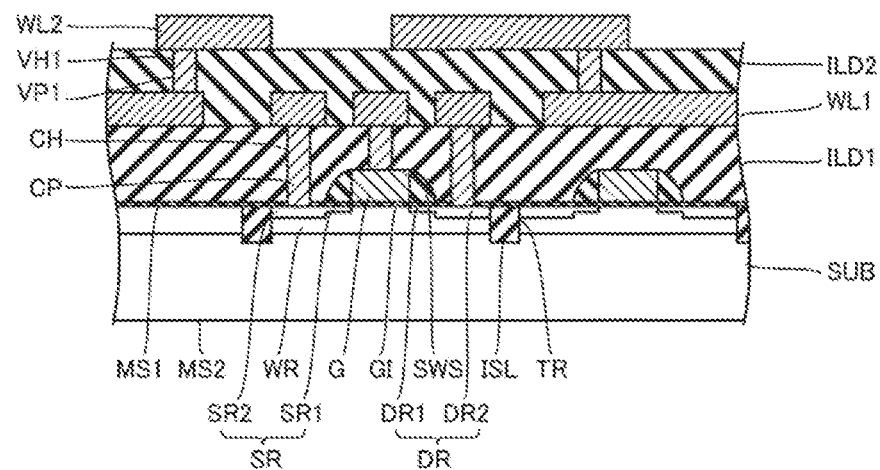
FIG. 17 is a sectional view for explaining a second wiring forming step S13.
Figure 18:
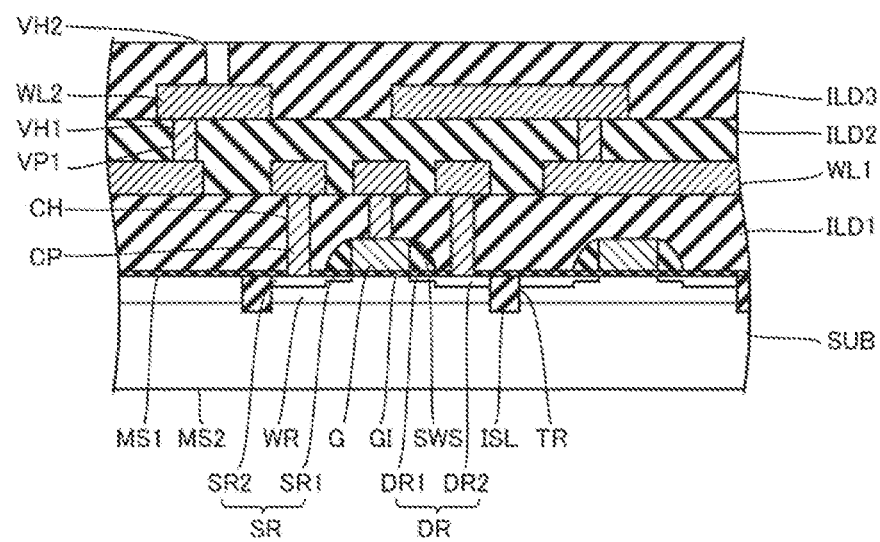
FIG. 18 is a sectional view for explaining a third interlayer insulating film forming step S14.
Figure 19:
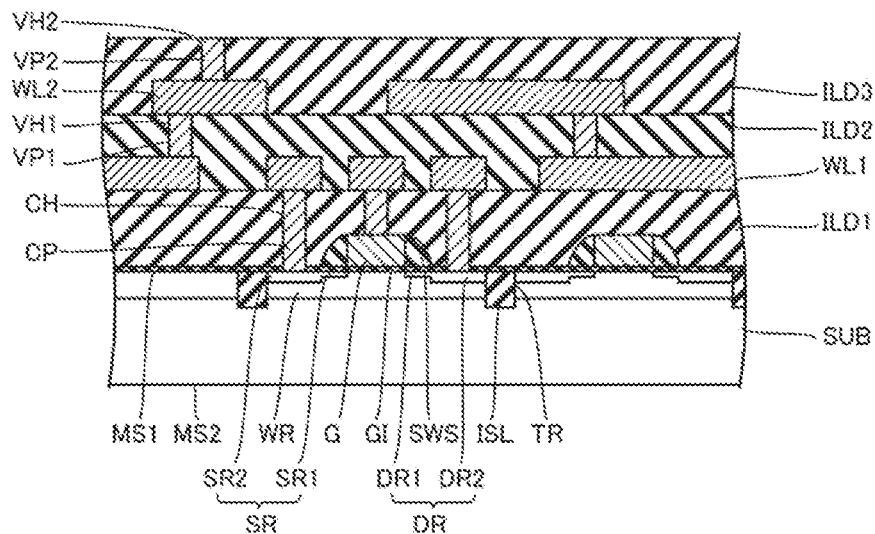
FIG. 19 is a sectional view for explaining a second via plug forming step S15.
Figure 20:
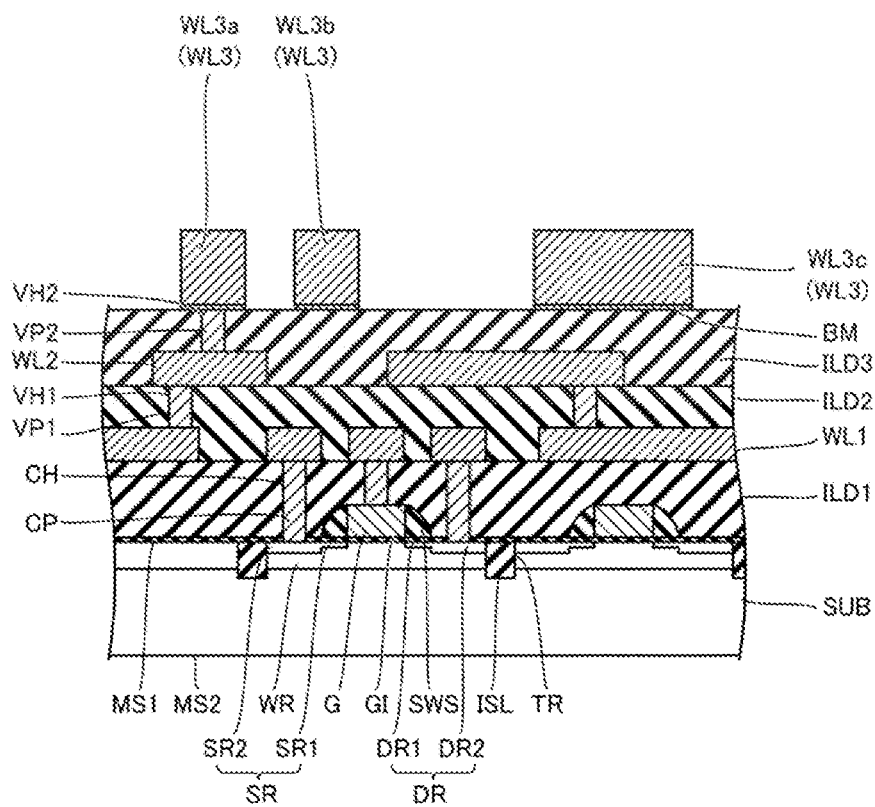
FIG. 20 is a sectional view for explaining a third wiring forming step S16.

FIG. 17 is a sectional view for explaining the second wiring forming step S13. As illustrated in FIG. 17, a wiring WL2 is formed in the second wiring forming step S13. FIG. 18 is a sectional view for explaining the third interlayer insulating film forming step S14. As illustrated in FIG. 18, an interlayer insulating film ILD3 is formed in the third interlayer insulating film forming step S14. FIG. 19 is a sectional view for explaining the second via plug forming step S15. As illustrated in FIG. 19, a via plug VP2 is formed in the second via plug forming step S15. FIG. 20 is a sectional view for explaining the third wiring forming step S16. As illustrated in FIG. 20, a wiring WL3 is formed in the third wiring forming step S16.

A method of forming the wiring WL2 and the wiring WL3 is similar to the method of forming the wiring WL1. The method of forming the interlayer insulating film ILD3 is similar to the method of forming the interlayer insulating film ILD2. The method of forming the via plug VP2 is similar to the method of forming the via plugs VP1.

The passivation film forming step S17 includes a silicon oxide film forming step S171, and a silicon nitride film forming step S172. The silicon oxide film forming step S171 includes a fourth layer forming step S171a, a first layer forming step S171b, a second layer forming step S171c, a third layer forming step S171d, and a fifth layer forming step S171e.

Figure 21A:
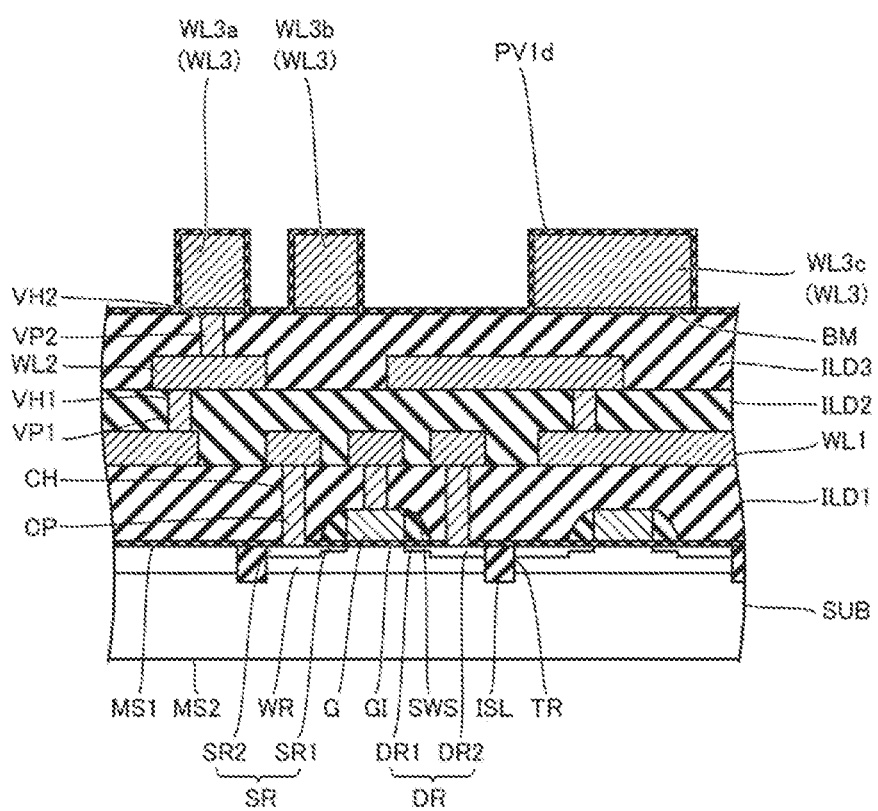
FIG. 21A is a sectional view for explaining a fourth layer forming step S171$a$.

FIG. 21A is a sectional view for explaining the fourth layer forming step S171a. As illustrated in FIG. 21A, a fourth layer PV1d is formed in the fourth layer forming step S171a. The formation of the fourth layer PV1d is performed by a parallel plate type Plasma Enhanced Chemical Vapor Deposition (PE-CVD) method, for example.

Figure 21B:
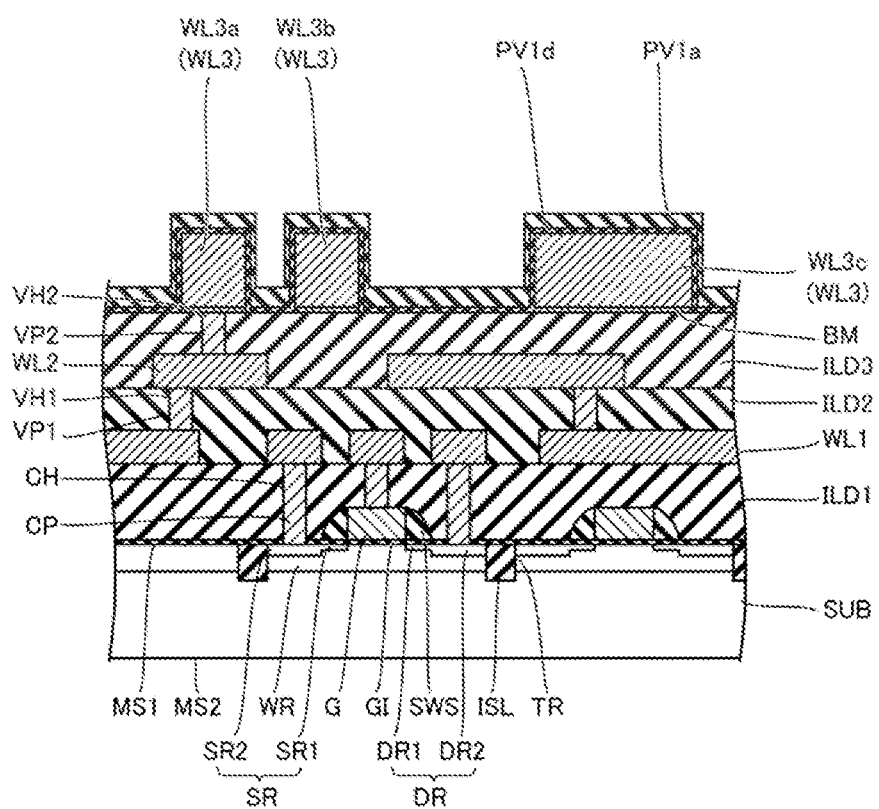
FIG. 21B is a sectional view for explaining a first layer forming step S171$b$.

FIG. 21B is a sectional view for explaining the first layer forming step S171b. As illustrated in FIG. 21B, a first layer PV1a is formed in the first layer forming step S171b. The formation of the first layer PV1a is performed by an HDP-CVD method. The first layer forming step S171b is finished before the third distance DIS3 exceeds 0.42 times as long as the first distance DIS1.

Figure 21C:
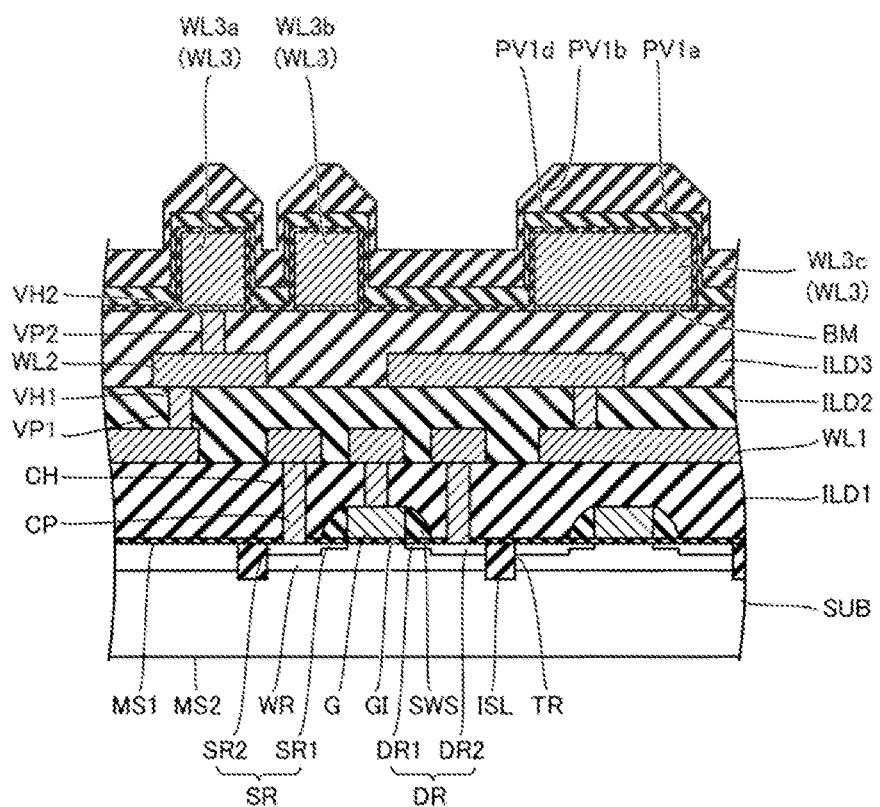
FIG. 21C is a sectional view for explaining a second layer forming step S171$c$.

FIG. 21C is a sectional view for explaining the second layer forming step S171c. As illustrated in FIG. 21C, a second layer PV1b is formed in the second layer forming step S171c. The formation of the second layer PV1b is performed by an HDP-CVD method. The second layer forming step S171c is finished after the fourth distance DIS4 becomes 0.65 times or more as long as the first distance DIS1.

Figure 21D:
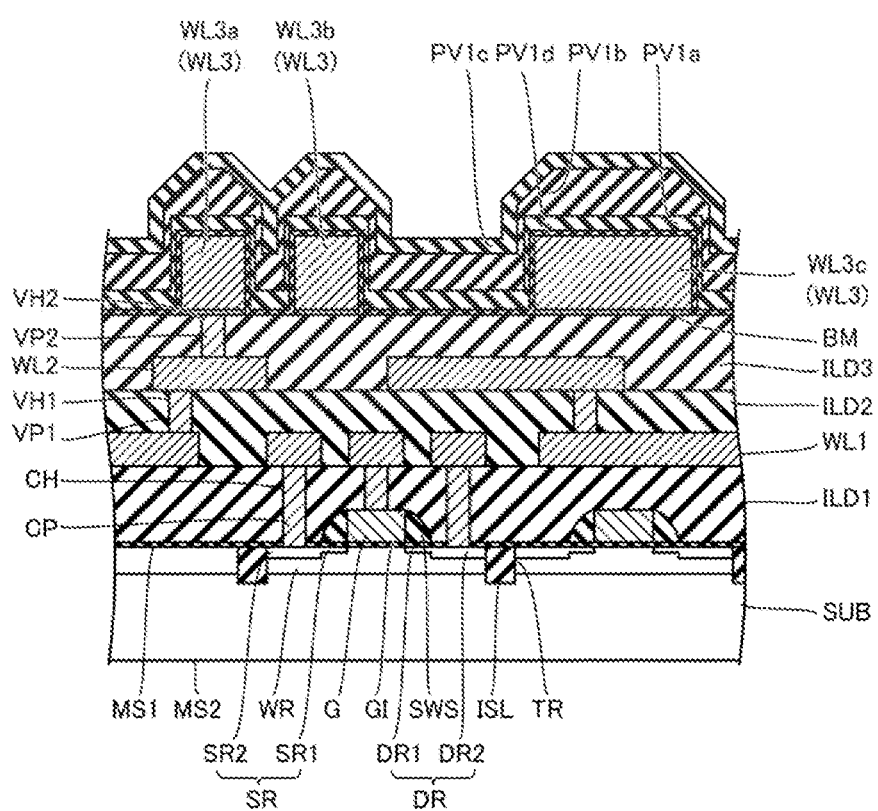
FIG. 21D is a sectional view for explaining a third layer forming step S171$d$.

FIG. 21D is a sectional view for explaining the third layer forming step S171d. As illustrated in FIG. 21D, a third layer PV1c is formed in the third layer forming step S171d. The formation of the third layer PV1c is performed by an HDP-CVD method. The third layer forming step S171d is finished after the fifth distance DIS5 becomes 1.00 times or more as long as the first distance DIS1. Note that in a case where the second layer forming step S171c is performed until the fourth distance DIS4 becomes 1.00 times or more as long as the first distance DIS1, the third layer forming step S171d may be omitted.

Figure 21E:
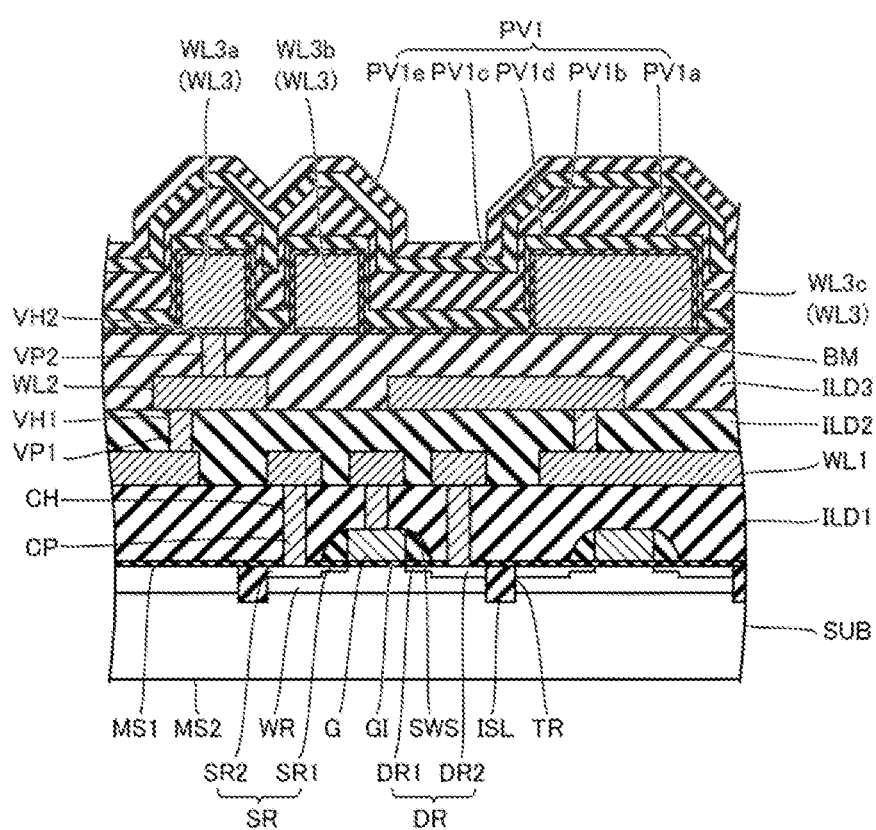
FIG. 21E is a sectional view for explaining a fifth layer forming step S171$e$.

FIG. 21E is a sectional view for explaining the fifth layer forming step S171e. As illustrated in FIG. 21E, a fifth layer PV1e is formed in the fifth layer forming step S171e. The formation of the fifth layer PV1e is performed by a parallel plate type PE-CVD method, for example.

Figure 22:
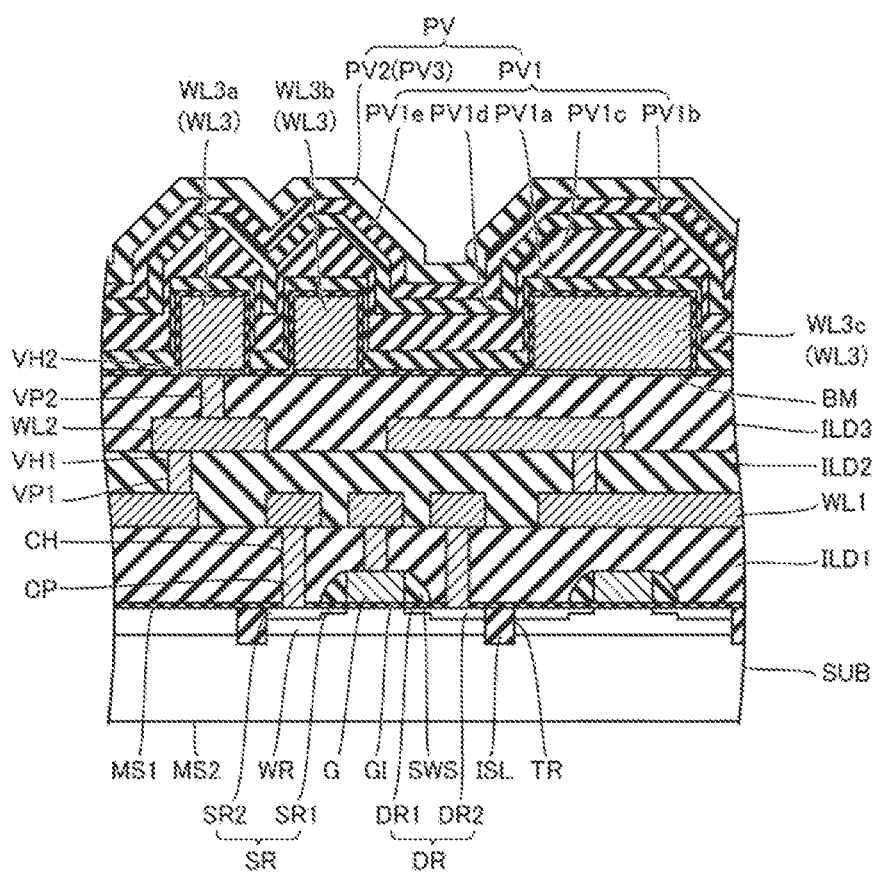
FIG. 22 is a sectional view for explaining a silicon nitride film forming step S172.

FIG. 22 is a sectional view for explaining the silicon nitride film forming step S172. As illustrated in FIG. 22, a silicon nitride film PV2 is formed in the silicon nitride film forming step S172. The formation of the silicon nitride film PV2 is performed by a parallel plate type PE-CVD method, for example. Note that in a case where the passivation film PV has a silicon oxynitride film PV3 instead of the silicon nitride film PV2, a silicon oxynitride film forming step S173 is performed instead of the silicon nitride film forming step S172. The formation of the silicon oxynitride film PV3 in the silicon oxynitride film forming step S173 is performed by a parallel plate type PE-CVD method, for example.

An opening OP is formed in the opening forming step S18. The formation of the opening OP is performed by dry etching, for example. As described above, the semiconductor device DEV1 having the structure illustrated in FIG. 1 to FIG. 3 is formed.

<Effects of Semiconductor Device DEV1>

Hereinafter, effects of the semiconductor device DEV1 will be described.

Figure 23:
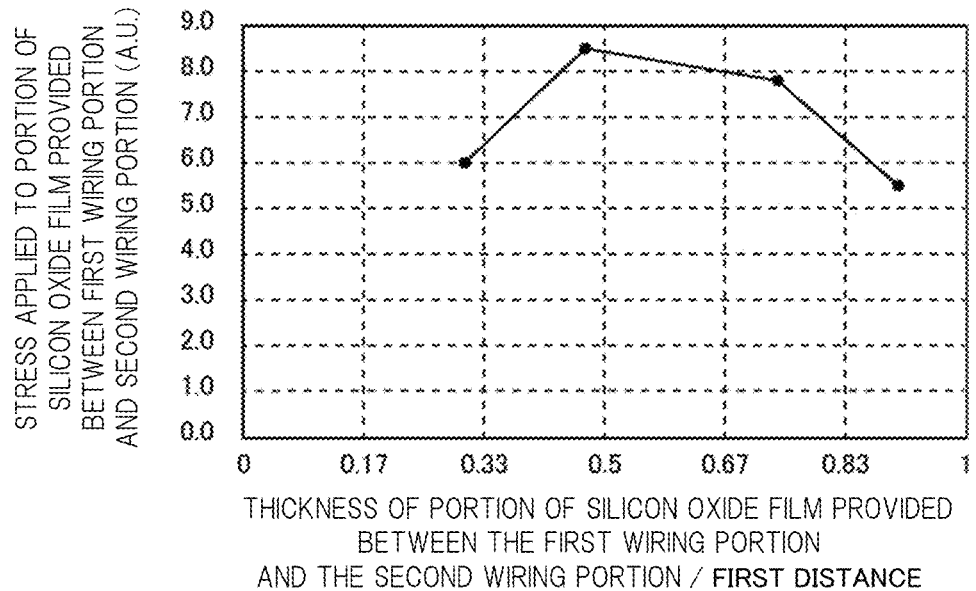
FIG. 23 is a simulation result illustrating a relationship between stress applied to a portion of a silicon oxide film PV1 and a thickness of the silicon oxide film PV1 when film formation temperature is returned to room temperature.

FIG. 23 is a simulation result illustrating a relationship between stress applied to a portion of a silicon oxide film PV1 and a thickness of the silicon oxide film PV1 when film formation temperature is returned to room temperature. A vertical axis in FIG. 23 denotes stress applied to a portion of the silicon oxide film PV1 provided between the first wiring portion WL3a and the second wiring portion WL3b. A horizontal axis in FIG. 23 is a value obtained by dividing a thickness of the portion of the silicon oxide film PV1 provided between the first wiring portion WL3a and the second wiring portion WL3b, by the first distance DIS1. Note that in the simulation illustrated in FIG. 23, the first distance DIS1 is set to 3 μm, and the second distance DIS2 is set to 2 μm. Further, in the simulation result illustrated in FIG. 23, film formation temperature is set to 400° C.

As illustrated in FIG. 23, when the value obtained by dividing the thickness of the portion of the silicon oxide film PV1 provided between the first wiring portion WL3a and the second wiring portion WL3b, by the first distance DIS1 becomes close to 0.5, the stress applied to the portion of the silicon oxide film PV1 provided between the first wiring portion WL3a and the second wiring portion WL3b becomes the maximum. When the value obtained by dividing by the thickness of the portion of the silicon oxide film PV1 provided between the first wiring portion WL3a and the second wiring portion WL3b, by the first distance DIS1, is further increased, the stress applied to the portion of the silicon oxide film PV1 provided between the first wiring portion WL3a and the second wiring portion WL3b starts to decrease.

Table 1 shows a result of observing the value obtained by dividing the thickness of the portion of the silicon oxide film PV1 provided between the first wiring portion WL3a and the second wiring portion WL3b, by the first distance DIS1 when the formation of the film is finished and presence or absence of a crack in the portion of the silicon oxide film PV1 provided between the first wiring portion WL3a and the second wiring portion WL3b.

TABLE 1

| Sample | First distance/thickness of portion of silicon oxide film provided between the first wiring portion and the second wiring portion at the end of film formation | Presence or absence of crack |
|---|---|---|
| 1 | 0.30 | Absence |
| 2 | 0.42 | Absence |
| 3 | 0.47 | Presence |
| 4 | 0.65 | Absence |
| 5 | 0.73 | Absence |

In Sample 1 to Sample 3, a silicon oxide film PV1 was formed by steps up to a first layer forming step S171b, and the subsequent steps were not performed. In Sample 4 and Sample 5, a silicon oxide film PV1 was formed by steps up to a second layer forming step S171c, and the subsequent steps were not performed. Note that in Sample 4 and Sample 5, a first layer forming step S171b was finished before a value obtained by dividing the first distance DIS1 by a third distance DIS3 by the first distance DIS1 exceeded 0.42.

As illustrated in Table 1, in Sample 1 and Sample 2, no crack was observed in the portion of the silicon oxide film PV1 provided between the first wiring portion WL3a and the second wiring portion WL3b. On the other hand, in Sample 3, a crack was observed in the portion of the silicon oxide film PV1 provided between the first wiring portion WL3a and the second wiring portion WL3b. In Sample 4 and Sample 5, no crack was observed in the portion of the silicon oxide film PV1 provided between the first wiring portion WL3a and the second wiring portion WL3b.

As illustrated in FIG. 23 and Table 1, in the method of manufacturing the semiconductor device DEV1, the first layer forming step S171b is finished before the value obtained by dividing the third distance DIS3 by the first distance DIS1 exceeds 0.42, and the second layer forming step S171c is finished after the value obtained by dividing the fourth distance DIS4 by the first distance DIS1 becomes 0.65 or more. Therefore, with respect to finish timing of the first layer forming step S171b and the second layer forming step S171c, timing at which the stress applied to the portion of the silicon oxide film PV1 provided between the first wiring portion WL3a and the second wiring portion WL3b becomes large is avoided. As a result, according to the semiconductor device DEV1, occurrence of a crack in the portion of the silicon oxide film PV1 provided between the first wiring portion WL3a and the second wiring portion WL3b is suppressed.

Note that from the viewpoint of suppressing the occurrence of the crack in the portion of the silicon oxide film PV1 provided between the first wiring portion WL3a and the second wiring portion WL3b, it can be considered that the first layer forming step S171b is performed until the value obtained by dividing the third distance DIS3 by the first distance DIS1 exceeds 1.00 times, and the second layer forming step S171c and the third layer forming step S171d are not performed.

However, in this case, an application time of bias in the HDP-CVD method becomes longer, and temperature of the wiring WL3 becomes excessively high. As a result, there is a concern that hillocks or whiskers may occur in the wiring WL3. Further, in this case, as a result of the longer application time of the bias in the HDP-CVD method, electric charge is accumulated between an electrostatic chuck holding a wafer and the wafer, and there is also a concern that the wafer sticks to the electrostatic chuck or the number of particles on the wafer increases.

Modification Example

In the above example, the first layer forming step S171b is to be performed once, but the first layer forming step S171b may be divided into and performed in a plurality of times. Namely, the first layer PV1a may be formed by a plurality of layers. However, when the final round of the first layer forming step S171b performed in the plurality of times is finished, the value obtained by dividing the third distance DIS3 by the first distance DIS1 does not exceed 0.42.

Second Embodiment

A semiconductor device according to a second embodiment will be described. The semiconductor device according to the second embodiment is referred to as a semiconductor device DEV2. Here, differences from the semiconductor device DEV1 will be mainly described, and duplicate explanation will not be repeated.

<Configuration of Semiconductor Device DEV2>

Hereinafter, a configuration of the semiconductor device DEV2 will be described.

The semiconductor device DEV2 includes a semiconductor substrate SUB, element isolation films ISL, gate insulating films GI, gates G, sidewall spacers SWS, an interlayer insulating film ILD1, contact plugs CP, wirings WL1, an interlayer insulating film ILD2, via plugs VP1, wirings WL2, an interlayer insulating film ILD3, a via plug VP2, wirings WL3, and a passivation film PV. In this regard, the configuration of the semiconductor device DEV2 is common to the configuration of the semiconductor device DEV1.

Figure 24:
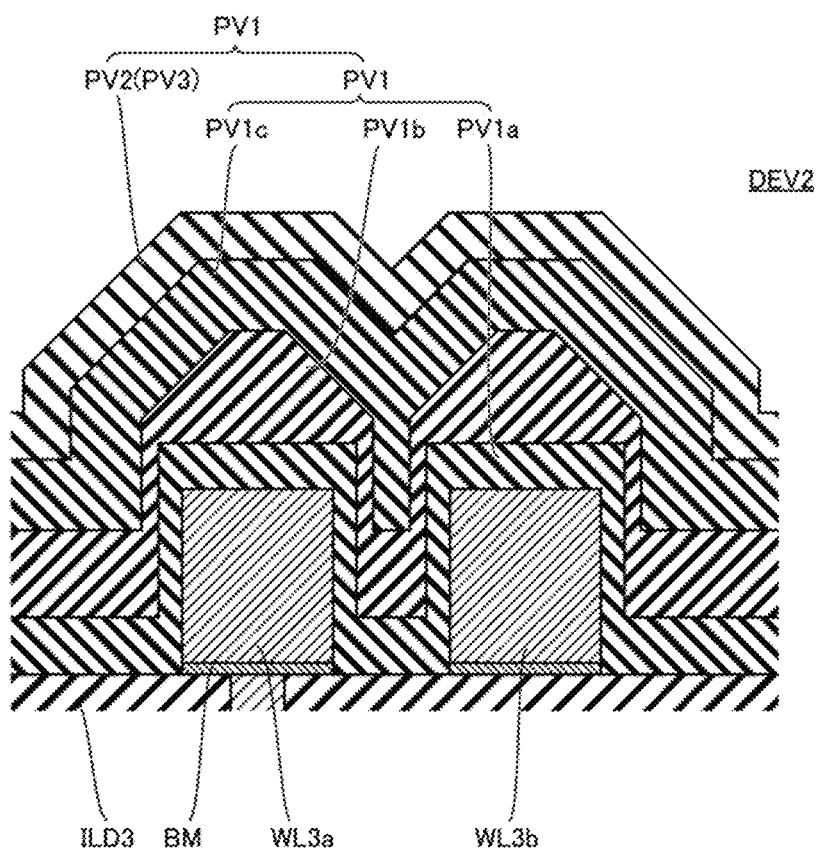
FIG. 24 is an enlarged sectional view of a semiconductor device DEV2.

FIG. 24 is an enlarged sectional view of the semiconductor device DEV2. FIG. 24 illustrates the enlarged sectional view of the semiconductor device DEV2 at a position corresponding to III in FIG. 3. As illustrated in FIG. 24, in the semiconductor device DEV2, a silicon oxide film PV1 does not have a fourth layer PV1d and a fifth layer PV1e. In this regard, the configuration of the semiconductor device DEV2 is different from the configuration of the semiconductor device DEV1.

<Method of Manufacturing Semiconductor Device DEV2>

Hereinafter, a method of manufacturing the semiconductor device DEV2 will be described.

Figure 25:
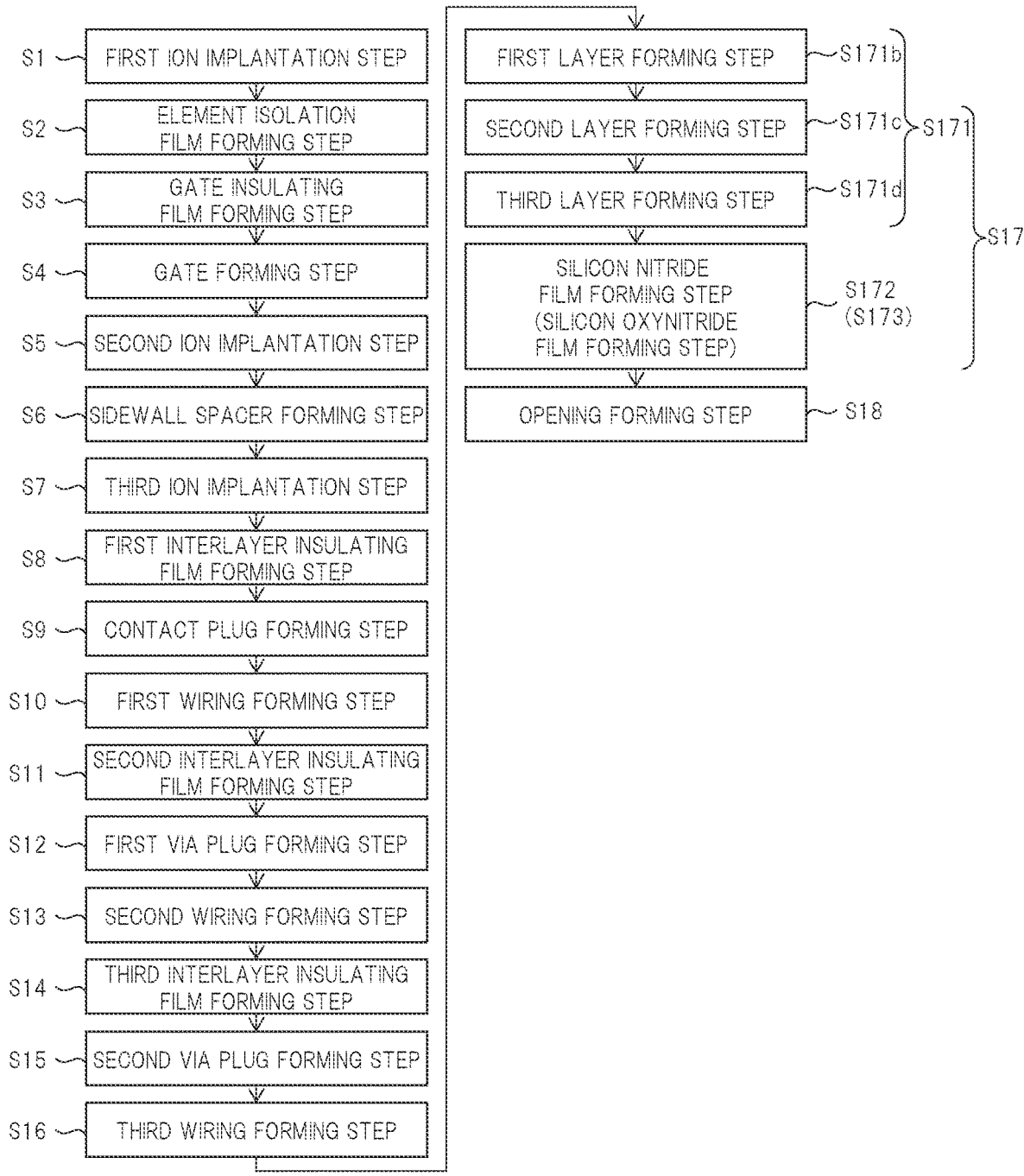
FIG. 25 is a process drawing illustrating a method of manufacturing the semiconductor device DEV2.

FIG. 25 is a process drawing illustrating the method of manufacturing the semiconductor device DEV2. As illustrated in FIG. 25, the method of manufacturing the semiconductor device DEV2 includes a first ion implantation step S1, an element isolation film forming step S2, a gate insulating film forming step S3, a gate forming step S4, a second ion implantation step S5, a sidewall spacer forming step S6, and a third ion implantation step S7.

Further, the method of manufacturing the semiconductor device DEV2 further includes a first interlayer insulating film forming step S8, a contact plug forming step S9, a first wiring forming step S10, a second interlayer insulating film forming step S11, a first via plug forming step S12, a second wiring forming step S13, a third interlayer insulating film forming step S14, a second via plug forming step S15, a third wiring forming step S16, a passivation film forming step S17, and an opening forming step S18. In this regard, the method of manufacturing the semiconductor device DEV2 is common to the method of manufacturing the semiconductor device DEV1.

The method of manufacturing the semiconductor device DEV2 is different from the method of manufacturing the semiconductor device DEV1 in that a silicon oxide film forming step S171 does not include a fourth layer forming step S171a and a fifth layer forming step S171e. Further, the method of manufacturing the semiconductor device DEV2 is also different from the method of manufacturing the semiconductor device DEV1 in details of a first layer forming step S171b and a third layer forming step S171d.

In the method of manufacturing the semiconductor device DEV2, the first layer forming step S171b is divided into a first stage and a second stage. Application of bias of an HDP-CVD method in the first stage of the first layer forming step S171b is weaker than application of bias of an HDP-CVD method in the second stage of the first layer forming step S171b. The fact that the application of bias of the HDP-CVD method in the first stage of the first layer forming step S171b is weaker than the application of bias of the HDP-CVD method in the second stage of the first layer forming step S171b includes a case where the bias of the HDP-CVD method in the first stage of the first layer forming step S171b is not applied.

In the method of manufacturing the semiconductor device DEV2, the third layer forming step S171d is divided into a first stage and a second stage. Application of bias of an HDP-CVD method in the second stage of the third layer forming step S171d is weaker than application of bias of an HDP-CVD method in the first stage of the third layer forming step S171d. The bias of the HDP-CVD method in the first stage of the third layer forming step S171d is applied, but the bias of the HDP-CVD method in the second stage of the third layer forming step S171d may not be applied.

<Effects of Semiconductor Device DEV2>

Hereinafter, effects of the semiconductor device DEV2 will be described.

In the method of manufacturing the semiconductor device DEV1, the parallel plate type PE-CVD method is used to perform the fourth layer forming step S171a before the first layer forming step S171b in order to suppress corners of the wiring WL3 from being spattered by the first layer forming step S171b. In the method of manufacturing the semiconductor device DEV2, the application of bias of the HDP-CVD method in the first stage of the first layer forming step S171b is weakened. Therefore, the corners of the wiring WL3 are less likely to be sputtered by the first layer forming step S171b, and this makes it possible to omit the fourth layer forming step S171a.

In the method of manufacturing the semiconductor device DEV1, the parallel plate type PE-CVD method is used to perform the fifth layer forming step S171e after the third layer forming step S171d in order to relax the shape of the upper surface of the third layer PV1c after the third layer forming step S171d is performed. In the method of manufacturing the semiconductor device DEV2, the application of bias of the HDP-CVD method in the second stage of the third layer forming step S171d is weakened. Therefore, the shape of the upper surface of the third layer PV1c after the third layer forming step S171d is performed is relaxed, and this makes it possible to omit the fifth layer forming step S171e.

As described above, according to the semiconductor device DEV2, since some steps can be omitted in the manufacturing process thereof, it is possible to reduce the manufacturing cost thereof.

Third Embodiment

A semiconductor device according to a third embodiment will be described. The semiconductor device according to the third embodiment is referred to as a semiconductor device DEV3. Here, differences from the semiconductor device DEV2 will be mainly described, and duplicate explanation will not be repeated.

<Configuration of Semiconductor Device DEV3>

Hereinafter, a configuration of the semiconductor device DEV3 will be described.

The semiconductor device DEV3 includes a semiconductor substrate SUB, element isolation films ISL, gate insulating films GI, gates G, sidewall spacers SWS, an interlayer insulating film ILD1, contact plugs CP, wirings WL1, an interlayer insulating film ILD2, via plugs VP1, wirings WL2, an interlayer insulating film ILD3, a via plug VP2, wirings WL3, and a passivation film PV. In this regard, the configuration of the semiconductor device DEV3 is common to the configuration of the semiconductor device DEV2.

Figure 26:
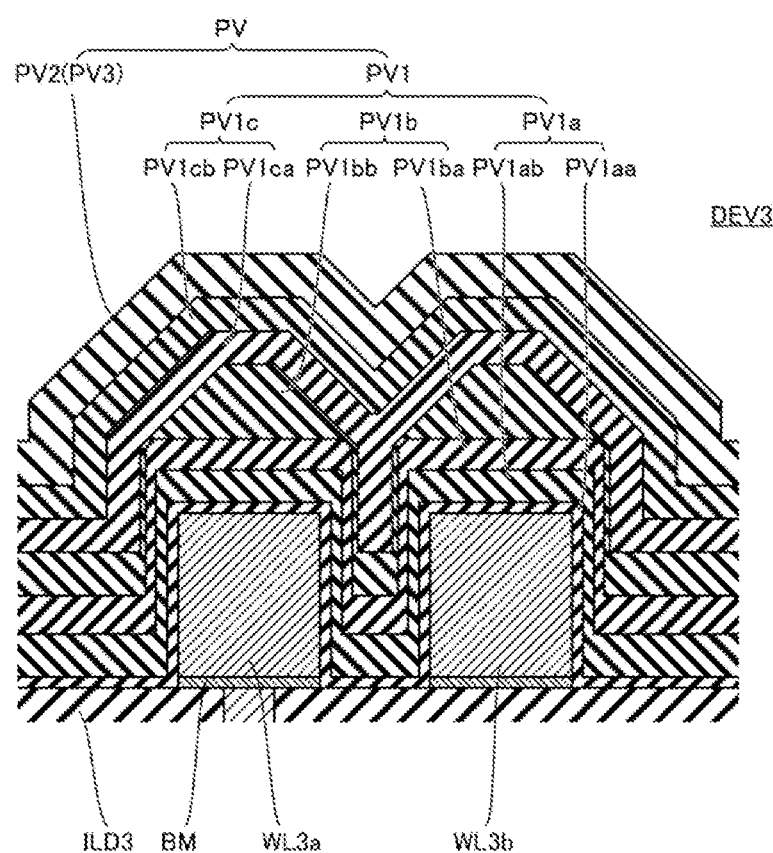
FIG. 26 is an enlarged sectional view of a semiconductor device DEV3.

FIG. 26 is an enlarged sectional view of the semiconductor device DEV3. FIG. 26 illustrates the enlarged sectional view of the semiconductor device DEV3 at a position corresponding to III in FIG. 3. As illustrated in FIG. 26, in the semiconductor device DEV3, a first layer PV1a has a layer PV1aa and a layer PV1ab; a second layer PV1b has a layer PV1ba and a layer PV1bb; and a third layer PV1c has a layer PV1ca and a layer PV1cb.

The layer PV1aa is formed of silicon oxide which is more silicon-rich than the layer PV1ab. The layer PV1ab is arranged on the layer PV1aa. Namely, the first layer PV1a is formed of partially silicon-rich silicon oxide. Note that the entire first layer PV1a may be formed of silicon-rich silicon oxide. The layer PV1ba is formed of silicon oxide which is more silicon-rich than the layer PV1bb. The layer PV1bb is arranged on the layer PV1ba. Namely, the second layer PV1b is formed of partially silicon-rich silicon oxide. Note that the entire second layer PV1b may be formed of silicon-rich silicon oxide.

The layer PV1ca is formed of silicon oxide which is more silicon-rich than the layer PV1cb. The layer PV1cb is arranged on the layer PV1ca. Namely, the third layer PV1c is formed of partially silicon-rich silicon oxide. Note that the entire third layer PV1c may be formed of silicon-rich silicon oxide. In this regard, the configuration of the semiconductor device DEV3 is different from the configuration of the semiconductor device DEV2.

In the above, the example in which each of the first layer PV1a, the second layer PV1b, and the third layer PV1c is configured by laminating a layer formed of silicon-rich silicon oxide and a layer formed of non-silicon-rich silicon oxide has been described. However, any of the first layer PV1a, the second layer PV1b, and the third layer PV1c may be configured by laminating a layer formed of silicon-rich silicon oxide and a layer formed of non-silicon-rich silicon oxide.

The refractive index of non-silicon-rich silicon oxide for light having a wavelength of 633 nm is about 1.45 to 1.46, while the refractive index of silicon-rich silicon oxide for light having a wavelength of 633 nm is 1.5 or more. Therefore, whether any or some of the first layer PV1a (the second layer PV1b, or the third layer PV1c) contains the layer of silicon-rich silicon oxide or not can be identified by measuring the refractive index, for example. Further, whether any or some of the first layer PV1a (the second layer PV1b, or the third layer PV1c) contains the layer of silicon-rich silicon oxide or not can also be identified by Fourier Transform Infrared Spectroscopy (FTIR).

<Method of Manufacturing Semiconductor Device DEV3>

Hereinafter, a method of manufacturing the semiconductor device DEV3 will be described.

Similar to the method of manufacturing the semiconductor device DEV2, the method of manufacturing the semiconductor device DEV3 includes a first ion implantation step S1, an element isolation film forming step S2, a gate insulating film forming step S3, a gate forming step S4, a second ion implantation step S5, a sidewall spacer forming step S6, and a third ion implantation step S7.

Further, similar to the method of manufacturing the semiconductor device DEV2, the method of manufacturing the semiconductor device DEV3 also includes a first interlayer insulating film forming step S8, a contact plug forming step S9, a first wiring forming step S10, a second interlayer insulating film forming step S11, a first via plug forming step S12, a second wiring forming step S13, a third interlayer insulating film forming step S14, a second via plug forming step S15, a third wiring forming step S16, a passivation film forming step S17, and an opening forming step S18.

Moreover, in the method of manufacturing the semiconductor device DEV3, a silicon oxide film forming step S171 includes a first layer forming step S171b, a second layer forming step S171c, and a third layer forming step S171d.

In the method of manufacturing the semiconductor device DEV3, each of the first layer forming step S171b, the second layer forming step S171c, and the third layer forming step S171d is divided into a first stage and a second stage.

Application of bias of an HDP-CVD method in the first stage of the first layer forming step S171b is weaker than application of bias of an HDP-CVD method in the second stage of the first layer forming step S171b. The fact that the application of bias of the HDP-CVD method in the first stage of the first layer forming step S171b is weaker than the application of bias of the HDP-CVD method in the second stage of the first layer forming step S171b includes a case where the bias of the HDP-CVD method in the first stage of the first layer forming step S171b is not applied. As a result, a layer PV1aa is formed in the first stage of the first layer forming step S171b, and a layer PV1ab is formed in the second stage of the first layer forming step S171b.

By changing between a gas ratio of an HDP-CVD method in the first stage of the first layer forming step S171b (more specifically, a flow ratio of oxygen ($O_2$) gas and monosilane ($SiH_4$) gas) and a gas ratio of an HDP-CVD method in the second stage of the first layer forming step S171b, the layer PV1aa is also formed in the first stage of the first layer forming step S171b, and the layer PV1ab is also formed in the second stage of the first layer forming step S171b.

With respect to the second layer forming step S171c (or the third layer forming step S171d), by changing the application of the bias of the HDP-CVD method or the gas ratio between the first stage and the second stage, it is possible to form a laminated structure of the layer PV1ba and the layer PV1bb (or the layer PV1ca and the layer PV1cb) in the similar manner.

<Effects of Semiconductor Device DEV3>

Hereinafter, effects of the semiconductor device DEV3 will be described.

The coefficient of thermal expansion of silicon oxide that is not silicon-rich, the coefficient of thermal expansion of silicon, and the coefficient of thermal expansion of aluminum are 0.55 ppm/° C., 2.6 ppm/° C., and 24 ppm/° C., respectively. Therefore, the coefficient of thermal expansion of silicon-rich silicon oxide is closer to the coefficient of thermal expansion of aluminum than the coefficient of thermal expansion of silicon oxide that is not silicon-rich. As a result, in the semiconductor device DEV3, stress applied to a portion of a silicon oxide film PV1 provided between a first wiring portion WL3a and a second wiring portion WL3b is relaxed due to a difference between the coefficient of thermal expansion of the silicon oxide film PV1 and the coefficient of thermal expansion of the wiring WL3, and a crack is less likely to occur in the portion.

As described above, the invention made by the inventors of the present application has been described specifically on the basis of the embodiments. However, the present invention is not limited to the embodiments described above, and it goes without saying that the present invention may be modified into various forms without departing from the substance thereof.

What is claimed is:

1. A method of manufacturing a semiconductor device, the method comprising steps of:
preparing a semiconductor substrate having a first main surface and a second main surface, the second main surface being an opposite surface of the first main surface;
forming a plurality of interlayer insulating films laminated and arranged on the first main surface in a thickness direction, the thickness direction being a direction from the second main surface toward the first main surface;
forming a top wiring on a top interlayer insulating film, the top interlayer insulating film being an interlayer insulating film of the plurality of interlayer insulating films and provided farthest from the first main surface in the thickness direction; and
forming a passivation film on the top interlayer insulating film so as to cover the top wiring,
wherein the top wiring includes a first wiring portion and a second wiring portion that extend in a first direction in plan view and are adjacent to each other in a second direction orthogonal to the first direction,
wherein a distance between an upper surface of the top wiring and the top interlayer insulating film in the thickness direction is defined as a first distance, and the first distance is 2.7 μm or more,
wherein the top wiring has a portion where a value obtained by dividing the first distance by a second distance is 1.35 or more, the second distance being a distance between the first wiring portion and the second wiring portion in the second direction,
wherein the step of forming the passivation film includes:
a step of forming a silicon oxide film; and
a step of forming a silicon nitride film or a silicon oxynitride film on the silicon oxide film,
wherein the step of forming the silicon oxide film includes:
a first step of forming a first layer by a PE-CVD method;
a second step of forming a second layer on the first layer by an HDP-CVD method; and
a third step of forming a third layer on the second layer by an HDP-CVD method,
wherein the second step is finished before a distance between an upper surface of a portion of the second layer, which is provided between the first wiring portion and the second wiring portion, and the top interlayer insulating film in the thickness direction exceeds 0.42 times or less as long as the first distance, and
wherein the third step is finished after a distance between an upper surface of a portion of the third layer, which is provided between the first wiring portion and the second wiring portion, and the top interlayer insulating film in the thickness direction becomes 0.65 times or more as long as the first distance.

2. The method according to claim 1, wherein the step of forming the silicon oxide film further includes a fourth step of forming a fourth layer on the third layer by an HDP-CVD method.

3. The method according to claim 1, wherein bias voltage or a gas ratio is changed during at least any of the second step and the third step.

4. The method according to claim 1, wherein the top wiring is formed of aluminum or an aluminum alloy.

* * * * *